United States Patent
Ikeda et al.

(10) Patent No.: US 7,180,806 B2
(45) Date of Patent: Feb. 20, 2007

(54) MEMORY DEVICE, REFRESH CONTROL CIRCUIT TO BE USED FOR THE MEMORY DEVICE, AND REFRESH METHOD

(75) Inventors: Shigeji Ikeda, Tokyo (JP); Shinichi Fukuda, Tokyo (JP); Isao Ohdaira, Kanagawa (JP); Toshihiko Sato, Kanagawa (JP)

(73) Assignee: Sony Corporation (JP)

( * ) Notice: Subject to any disclaimer, the term of this patent is extended or adjusted under 35 U.S.C. 154(b) by 392 days.

(21) Appl. No.: 10/786,834

(22) Filed: Feb. 25, 2004

(65) Prior Publication Data
US 2004/0179416 A1 Sep. 16, 2004

(30) Foreign Application Priority Data
Mar. 10, 2003 (JP) ............................ P2003-062774

(51) Int. Cl.
*G11C 7/00* (2006.01)
(52) U.S. Cl. ............. 365/222; 365/230.03; 365/230.06
(58) Field of Classification Search ................ 365/222, 365/230.03, 230.06
See application file for complete search history.

(56) References Cited

U.S. PATENT DOCUMENTS

| 6,285,616 B1 * | 9/2001 | Ikabata ...................... 365/222 |
| 6,366,515 B2 * | 4/2002 | Hidaka ...................... 365/222 |
| 6,385,113 B1 | 5/2002 | Longwell et al. |

FOREIGN PATENT DOCUMENTS

EP 1 256 957 A2 11/2002

\* cited by examiner

*Primary Examiner*—Huan Hoang
(74) *Attorney, Agent, or Firm*—Lerner, David, Littenberg, Krumholz & Mentlik, LLP

(57) ABSTRACT

A memory space of a memory cell array is divided into a plurality of submemory spaces. A refresh control circuit executes a control of performing refreshment of information to the submemory spaces that are in use at the time of the refreshment of the information and need the refreshment among the plurality of submemory spaces and executes a control of not performing the refreshment to the submemory spaces that are not in use and do not need the refreshment.

15 Claims, 9 Drawing Sheets

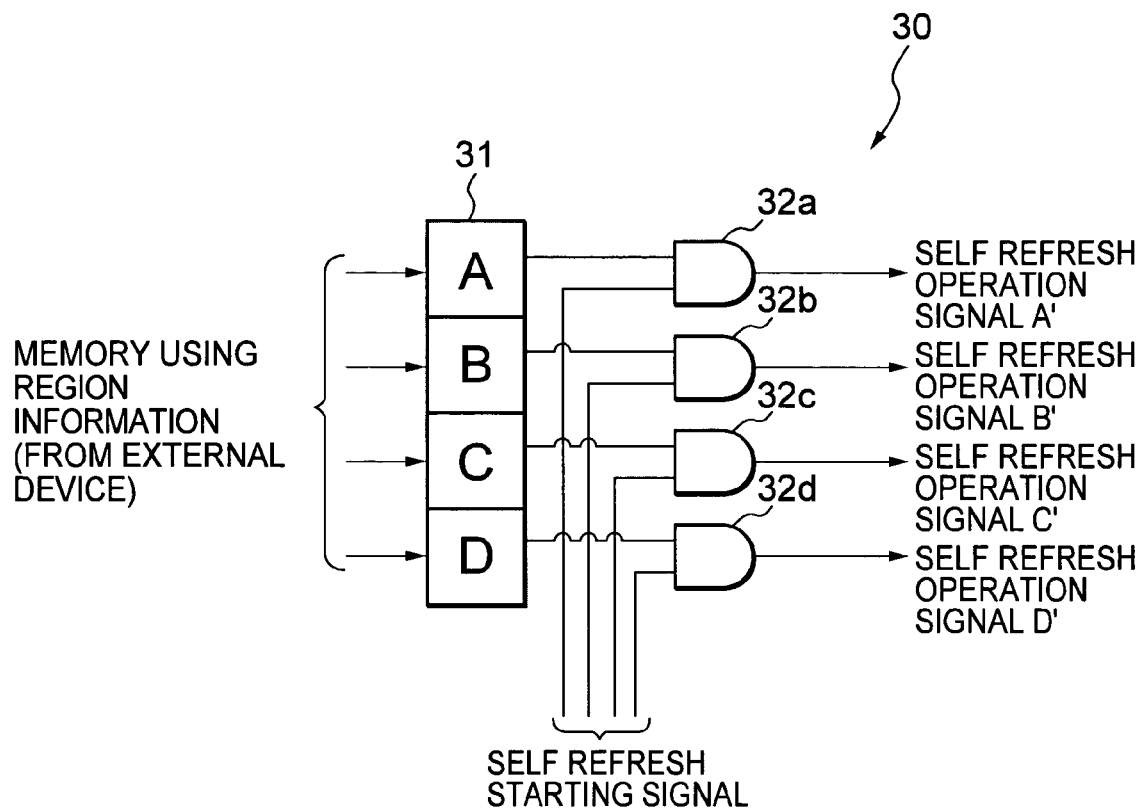

| CONTENTS OF MODE REGISTER | SELF REFRESH PERFORMING REGION |
|---|---|
| "00" | ALL OF REGIONS A, B, C, D |
| "01" | REGIONS A, B, C |
| "10" | REGIONS A, B |
| "11" | REGION A |

(PRIOR ART)

MEMORY DEVICE, REFRESH CONTROL CIRCUIT TO BE USED FOR THE MEMORY DEVICE, AND REFRESH METHOD

CROSS REFERENCES TO RELATED APPLICATIONS

The present document is based on Japanese Priority Document JP 2003-062774, filed in the Japanese Patent Office on Mar. 10, 2003, the entire contents of which being incorporated herein by reference.

BACKGROUND OF THE INVENTION

1. Field of the Invention

The present invention relates to a memory device of a dynamic type such as a dynamic random access memory (DRAM), a refresh control circuit to be used for the memory device, and a refresh method.

2. Description of the Related Art

A memory device of a dynamic type has been conventionally used as a memory device applicable to a computer apparatus and the like. As a typical memory device, a semiconductor memory device such as the so-called DRAM is known.

FIG. 9 shows an example of the schematic configuration of a memory cell 900. The memory cell 900 uses a transistor element 901 as a switching element. The turning on and off of the transistor element 901 is controlled through a word line 903. Data (charge) writing and data reading of the memory cell 900 are set to be controlled through a bit line 902. The charge quantity held in a capacitor (an electric capacity unit) 904 of the memory cell 900 is gradually decreased at every performance of a read operation, or owing to various kinds of parasitic capacitance and natural discharge. When the charge quantity becomes smaller than a fixed value, the content stored in the capacitor 904 is lost (or volatilized). Accordingly, such a memory device of a dynamic type as the DRAM needs the so-called refresh operation, by which charge held in the memory cell 900 till then is amplified and is re-written.

A typical example of this kind of dynamic-type memory device, a DRAM 800, as schematically simplified to be shown in FIG. 10, includes a memory array unit 801 and a memory control unit 820 as its principal parts. The memory array unit 801 is structured to arrange memory elements (memory cells) 802 of a dynamic type in an array. The memory elements 802 severally store information in the state of binary numbers based on a charge holding state and a charge not holding state. The memory control unit 820 is provided between the memory array unit 801 and an external memory control-device 810. The memory control unit 820 controls the reading of information from the memory array unit 801 and the writing of information to the memory array unit 801 in accordance with a command signal and the like from the memory control device 810.

This kind of the memory device (the DRAM 800) has an auto-refresh function for performing a refresh operation on the basis of a refresh request from the external memory control device 810, and a self refresh function for executing a refresh operation automatically at every satisfaction of a set condition, such as every elapse of a predetermined time, every decrease of a held charge quantity under a predetermined value, or the like, after the condition of the memory device has been set by the external memory control device 810.

A refresh operation of a memory device of a dynamic type like a DRAM in a case of the self refresh function is once performed at every elapse of the time of tREF/m, where "tREF" designates a memory holding time and "m" designates the number of addresses necessary for refreshing the whole memory addresses. For example, supposing that tREF=64 [ms] and m=4096, the refresh operation is performed at every elapse of 15.6 [μs].

In many cases, such a self refresh function is generally adopted as a refresh method in a DRAM or the like to be used for electric equipment, such as a personal computer or a mobile telephone, which uses a small-sized battery having a limited capacity as its power source and is needed to hold stored contents for a long time.

Now, because the above-mentioned self refresh function performs amplification of the charges held in the memory cells and the re-writing of the amplified charges to the original memory cells, the performance of the self refresh function needs electric power at the time of the amplification. Consequently, the performance consumes electric power therefor from a power system. Because it is requested for electric equipment such as a personal computer and a mobile telephone to be used without additional charging of a power source such as a battery having a limited capacity for a long time, the self refresh function performed in a DRAM or the like is strongly requested to decrease power consumption at the time of the performance of the function.

Accordingly, in a conventional technique, a method has been proposed. By the method, a mode register 821 is provided in the memory control unit 820 for decreasing the current consumption at the self refresh function, and the self refresh function is performed only to a predetermined memory space in conformity with a control condition set in the mode register 821.

For example, Patent Document 1 proposes an invention by which whether each of the addresses is a using memory space or not is previously stored to all of the addresses of a memory cell array, and refreshing is not performed to the addresses which are not used (not a using memory space). A further concrete aspect thereof is a method by which boundary addresses between a using memory space and a not using memory space in the whole address space are previously stored, and the refreshing is not performed to the not using memory space having the addresses larger than the boundary addresses. However, the conventional invention does not aim the decrease of power consumption as a first primary object, rather aims to prevent the lowering of a processing data rate. Consequently, the technique of this Pat. No. 2,829,998 cannot always achieve the decrease of power consumption.

Alternatively, as another conventional technique for controlling such kind of refresh function, for example, a technique schematically shown in FIGS. 11 and 12 is known. That is, correspondence relations between the contents of the setting of the control method of the mode register 821 storing two-bit information and the memory spaces to which self refreshing is performed are determined in advance. In addition, all of the address spaces are previously divided into a plurality of memory spaces such as a memory space A, a memory space B, a memory space C and a memory space D, and the contents of the mode register 821 is made to be written at the time of the starting of the memory device. Then, for example, in a case where the contents of the mode register 821 is "11", self refreshing is performed only to the memory space A, a top quarter of the whole memory space of the memory device, and the self refreshing is not performed to the other part of the whole memory space (i.e., the self refreshing at that time is omitted). In such a way, as shown in FIG. 12, only the quarter of the whole address space receives the self refresh operation, the current consumption necessary for the self refresh operation at that time can be decreased to about a quarter of the current consumption necessary for the self refresh operation for the whole address space.

Alternatively, for example, Patent Document 2 proposes a technique for realizing an inexpensive memory having a large memory capacity and a small data holding current by modularizing a DRAM, a static random access memory (SRAM) and a nonvolatile memory device into a package.

[Patent Document 1]: Japanese Patent No. 2829998 (Claims and the Whole Detailed Description of the Invention)

[Patent Document 2]: Japanese Patent Application Laid-Open Publication No. 2001-344967 (Claims and the Whole Detailed Description of the Invention)

However, because the technique proposed by the Patent Document 1 stores whether each address of the whole address of the memory cell array is a using memory space or not, the technique has a problem such that memory means for the storage and means for reading data from the memory means and for discriminating the necessity of refreshment of all of the addresses to control the refreshment operation become very complicated. In addition, because the memory cell array has a tendency to increase its capacity more and more, the number of addresses further increases. Consequently, there is another problem such that the means for storing whether all of the addresses are severally using memory spaces or not to discriminate the addresses is obliged to be complicated more and more.

Moreover, as a further detailed aspect, boundary addresses of using memory spaces and not using memory spaces in the whole address space are previously stored, and refreshment is not performed to not using memory spaces having larger addresses than the boundary addresses. However, by such a method, refreshment is performed to the spaces before the boundary addresses and is not performed to the spaces after the boundary addresses. In such a way, the whole address space can be divided into only two spaces at the boundary addresses as a boundary line. Consequently, for example, the following control cannot be realized: the whole address space is divided into four memory spaces, and only the second memory space and the third memory space of the four spaces from the top are in use and refreshment is performed to the second and the third memory spaces.

Moreover, in the refresh method schematically shown in FIGS. 11 and 12, which may be a variation of such a technique of the invention proposed in the Patent Document 1, the setting of the mode register 821 is performed at the time of turning of its power source or at the time of initialization such as system resetting. Consequently, the refreshing method is effective to a case where the memory space to be stored and held minimally is previously known like a case such as an operating system (OS), but the refreshing method has a problem in which memory spaces cannot be utilized effectively sometimes or the decrease of power consumption cannot be achieved effectively sometimes in a case where the spaces actually necessary to be used vary dependently on the sizes of data to be stored each time such as a user space, because the memory spaces to be actually used become different from the setting at the time of turning on its power source or at the time of initialization such as system resetting.

For example, in a case where refreshment is set to be performed only to the memory space A at the time of initialization, when the quantity of data to be stored becomes large and all of the memory space A is used, and also when the memory space B is tried to be used in such a case, it is set not to perform refreshment to the memory space B, and consequently the memory space B cannot be used in effect.

Furthermore, by the technique according to the invention proposed by the Patent Document 1, in a case where the memory spaces A, C and D are not in use and only the memory space B is in use, the boundary addresses are located at the end of the memory space B, and consequently refreshment is performed also to the memory space A, which is not to be needed to be refreshed actually, in vain. Hence, sufficiently effective decrease of power consumption cannot be achieved by the technique. This situation also applies to the technique shown in FIGS. 11 and 12.

Moreover, the technique proposed by the Patent Document 2 modularizes a DRAM device, an SRAM device, a nonvolatile memory device into a package, but does not perform the decrease of power consumption of each device. Consequently, it is needless to say that the technique cannot, achieve the decrease of power consumption of the memory device of a dynamic type such as the DRAM device. Moreover, because the DRAM device, the SRAM device and the nonvolatile memory device are modularized in one package, there is possibility that the whole configuration thereof becomes very complicated.

SUMMARY OF THE INVENTION

The present invention was made in consideration of such problems, and aims to provide a simply configured memory device which can achieve a sufficiently effective decrease of the consumption power of a refresh operation of the memory device even if the sizes of memory spaces to be used change each time, a refresh control circuit to be used for the memory device, and a refresh method.

A first memory device according to an aspect of the present invention is a semiconductor memory device of a dynamic type for refreshing information stored in a memory space to hold the information continuously by amplifying the information stored in the memory space to rewrite the amplified information in the memory space. The semiconductor memory device includes a refresh control circuit for performing refreshment of the information only to a sub memory space which is in use when the refreshment of the information is performed, the sub memory space holding the information necessary to be refreshed, among a plurality of sub memory spaces formed by previous division of the memory space.

A second memory device according to an aspect of the present invention is a semiconductor memory device of a dynamic type including a memory cell array. The memory device has the memory cell array for storing information, and a refresh circuit for refreshing the information stored in the memory cell array to hold the information continuously by amplifying the information stored in the memory cell array to rewrite the amplified information in the memory cell array. The memory device includes a refresh control circuit for controlling an operation of the refresh circuit so as to perform refreshment of the information only to a sub memory space which is in use when the refreshment of the information is performed, the sub memory space holding the information necessary to be refreshed, among a plurality of sub memory spaces formed by previous division of an address space in a memory space of the memory cell array.

A first refresh control circuit according to an aspect of the present invention is a refresh control circuit to be used for the first memory device described above.

A second refresh control circuit according to an aspect of the present invention is a refresh control circuit to be used for the second memory device described above.

A first refresh control method according to an aspect of the present invention is a method for refreshing storage in a memory device of a dynamic type for refreshing information stored in a memory space to hold the information continuously by amplifying the information stored in the memory space to rewrite the amplified information in the memory space. The method includes the steps of: dividing the memory space into a plurality of sub memory spaces in advance; and performing refreshment of the information only to a sub memory space among the plurality of sub memory spaces, the sub memory space being in use when the refreshment of the information is performed, the sub memory space holding the information necessary to be refreshed.

A second refresh control method according to an aspect of the present invention is a refresh method for refreshing information stored in a memory cell array to hold the information continuously by amplifying the information to rewrite the amplified information in the memory cell, the memory cell array is provided in a memory device of a dynamic type. The method includes the steps of: dividing an address space in a memory space of the memory cell array into a plurality of sub memory spaces in advance; and performing refreshment of the information only to a sub memory space among the plurality of sub memory spaces, the sub memory space being in use when the refreshment of the information is performed, the sub memory space holding the information necessary to be refreshed.

In the first memory device, the first refresh control circuit or the first refresh control method according to the aspects of the present invention, a memory space is previously divided into a plurality of sub memory spaces. Moreover, the refreshment of information is performed only to a sub memory space which is in use at the time of the refreshment of the information and holds the information necessary to be refreshed among the plurality of sub memory spaces. The refreshment of the information is not performed to the sub memory spaces which are not in use at the time of the refreshment and do not need the refreshment. Consequently, the refreshment to such parts unnecessary to be refreshed is omitted, and thereby at least the decrease of the power consumption required for refreshing that parts can be achieved.

In the second memory device, the second refresh control circuit or the second refresh control method according to the aspects of the present invention, an address space in a memory space of a memory cell array is previously divided into a plurality of sub memory spaces. Moreover, the refreshment of information is performed to a sub memory space which is in use at the time of the refreshment of the information and holds the information necessary to be refreshed among the plurality of sub memory spaces. The refreshment of the information is not performed to the sub memory spaces which are not in use at the time of the refreshment and do not need the refreshment. Consequently, the refreshment to such parts unnecessary to be refreshed is omitted, and thereby at least the decrease of the power consumption required for refreshing that parts can be achieved.

Hereupon, the first memory device, the first refresh control circuit or the first the refresh control method according to the aspects of the present invention can be applied to a memory device of a dynamic type, a refresh control circuit or a refresh control method which stores information into a memory space, and which amplifies the information stored in the memory space to rewrite the amplified information into the memory space, and further which refreshes the information to hold continuously thereby. Consequently, it is needless to say that the memory device to which the present invention can be applied is not always limited only to the memory device, such as a DRAM, which stores information as binary data based on a charge holding state and a not charge holding state in a memory cell. However, more specifically, the present invention is suitably applied to a semiconductor memory device, such as a DRAM, among existing kinds of memory devices. Such a semiconductor memory device of a dynamic type includes a memory cell array for storing information, and a refresh circuit for refreshing the information stored in the memory cell array to hold the information continuously by amplifying the information and re-writing the information into the memory cell array. That is, the second memory device, the second refresh control circuit or the second refresh control method according to the aspects of the present invention is suitable for the memory device of a dynamic type provided with such a memory cell array.

Incidentally, the refresh control circuit may operates a logical product of data pertaining to whether each of the sub memory spaces is in use or not and refresh address data to be input to each address, and may perform control of whether the refreshment is performed or not to each sub memory with the refresh circuit on the basis of a result of the operation. The reason of adopting such a configuration is that the configuration of the principal part of the refresh control circuit preferably becomes simple.

Moreover, a row decoder may be added to the memory cell array, and the row decoder may be set to specify a row address to which the refreshment is performed in addresses of the memory cell array, and further a refresh control circuit may be inserted between the memory cell array and the row decoder to intervene in a function of the row decoder for specifying the row address to which the refreshment is performed for controlling whether the refreshment is performed or not to each of the sub memory spaces. Alternatively, the refresh control circuit may be provided (built) in the row decoder.

In such a configuration, it preferably becomes possible to add the refresh control circuit easily to a memory device having an existing general circuit configuration without complicating the circuit system thereof.

Alternatively, a row decoder and a refresh address counter may be added to the memory cell array, and the row decoder and the refresh address counter may be set to specify the row address to which the refreshment is performed in addresses of the memory cell array, and further a refresh control circuit may be attached to the refresh address counter to intervene in a function of the refresh address counter for outputting the row address to which the refreshment is performed for controlling whether the refreshment is performed or not to each of the sub memory spaces. Alternatively, the refresh control circuit may be provided in the refreshment address counter.

In such a configuration, it preferably becomes possible to add the refresh control circuit easily to a memory device having an existing general circuit configuration without complicating the circuit system thereof.

Alternatively, a row decoder, a multiplexer and a refresh address counter may be connected to the memory cell array in this order, and the row decoder, the multiplexer and the refresh address counter may be set to specify the row address to which the refreshment is performed in addresses of the memory cell array, and further a refresh control circuit may be inserted between the refresh address counter and the multiplexer to intervene in a refresh address counter's output of the row address to which the refreshment is performed, the output transmitted to the row decoder through the multiplexer, for controlling whether the refreshment is performed or not to each of the sub memory spaces. Alternatively, the refresh control circuit may be provided in the multiplexer.

In such a configuration, it preferably becomes possible to add the refresh control circuit easily to a memory device having an existing general circuit configuration without complicating the circuit system thereof.

Moreover, in a case where the memory space is previously divided into different memory spaces to store different kinds of contents of information from one another, at least one of the divided memory spaces may be further divided into the plurality of sub memory spaces.

Such a configuration makes it possible to subdivide a memory space divided (assigned) as, for example, a user space into a plurality of sub memory spaces to discriminate whether to perform refreshment or whether to omit the refreshment to each of the sub memory spaces on the basis of whether the memory spaces are in use at the time of refreshment or not, namely whether refreshment is actually necessary or not. In addition, the refreshment is not performed to the memory spaces unnecessary to be refreshed, and the refreshment is performed to the memory spaces necessary to be refreshed. Thereby, all of the memory spaces are always made to be usable for the storage of information, and power consumption owing to unnecessary refreshment can be decreased.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 2 is a diagram showing a configuration of a principal part of a refresh control circuit;

FIG. 3 is a table showing relations between contents of information held in each bit in a using memory space register and a region to be an object to which self refreshment is performed;

DETAILED DESCRIPTION OF THE PREFERRED EMBODIMENTS

In the following, the preferred embodiments of the present invention will be described in detail by reference to the attached drawings.

Figure 1:
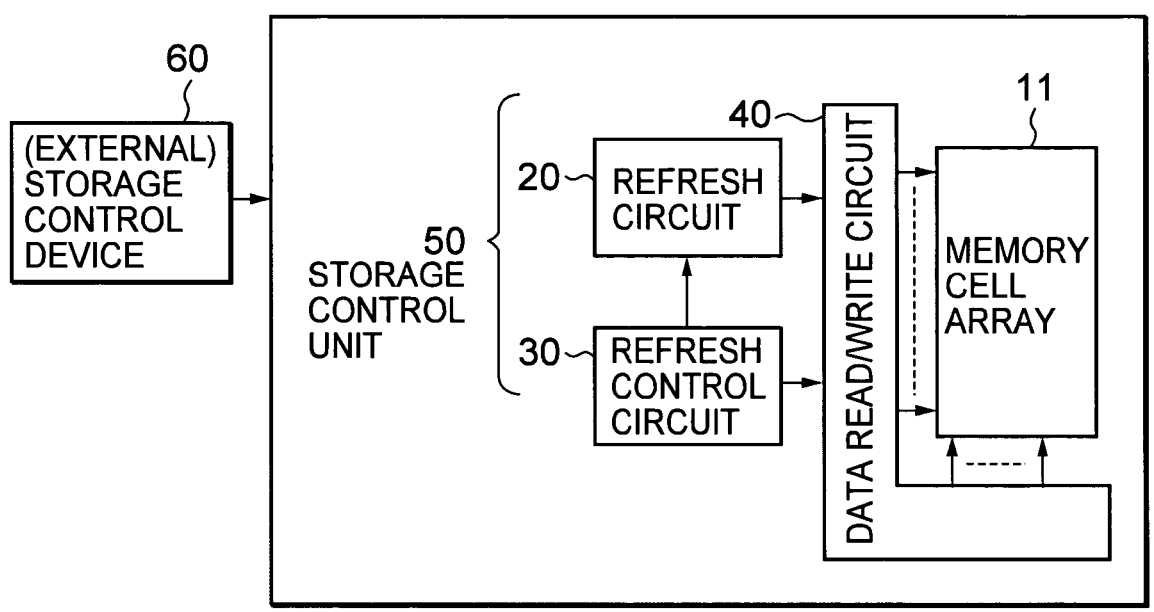
FIG. 1 is a diagram showing a schematic configuration of a memory device according to an embodiment of the present invention.

FIG. 1 is a diagram showing a schematic configuration of a memory device according to an embodiment of the present invention by simplifying the memory device. Incidentally, because a refresh method according to the present invention is embodied by an operation or work of the memory device, and because a refresh control circuit according to the present invention is used by being incorporated in the memory device, the refresh method and the refresh control circuit will be described in the following together with the memory device.

The principal part of the memory device includes a memory cell array 11, a refresh circuit 20, a refresh control circuit 30 and a data read/write circuit 40. The memory device is a dynamic-type one such as a DRAM. Incidentally, the refresh circuit 20, the refresh control circuit 30 and the data read/write circuit 40 can be collectively called as a memory control unit 50.

Figure 9:
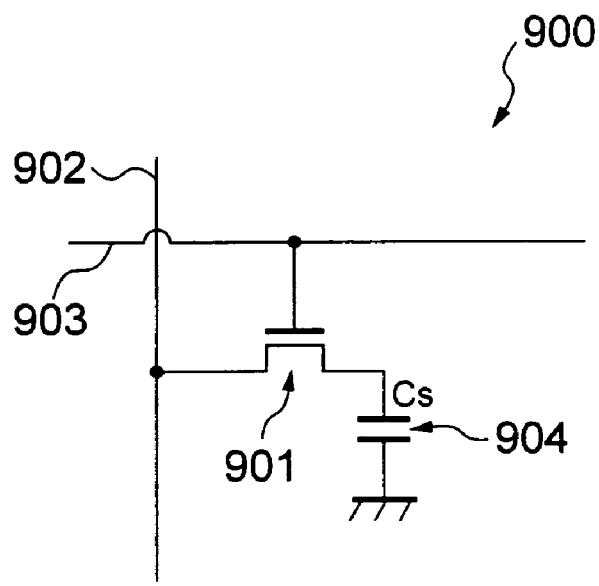
FIG. 9 is a circuit diagram showing an example of a schematic configuration of a memory cell in a conventional general DRAM.
Figure 10:
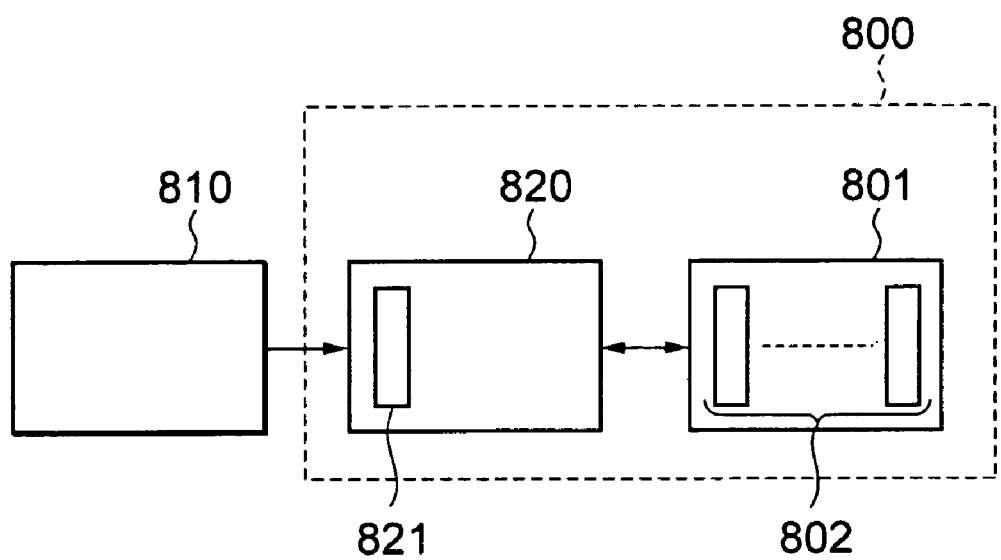
FIG. 10 is a block diagram showing a schematic configuration of the conventional general DRAM.
Figures 11, 12:
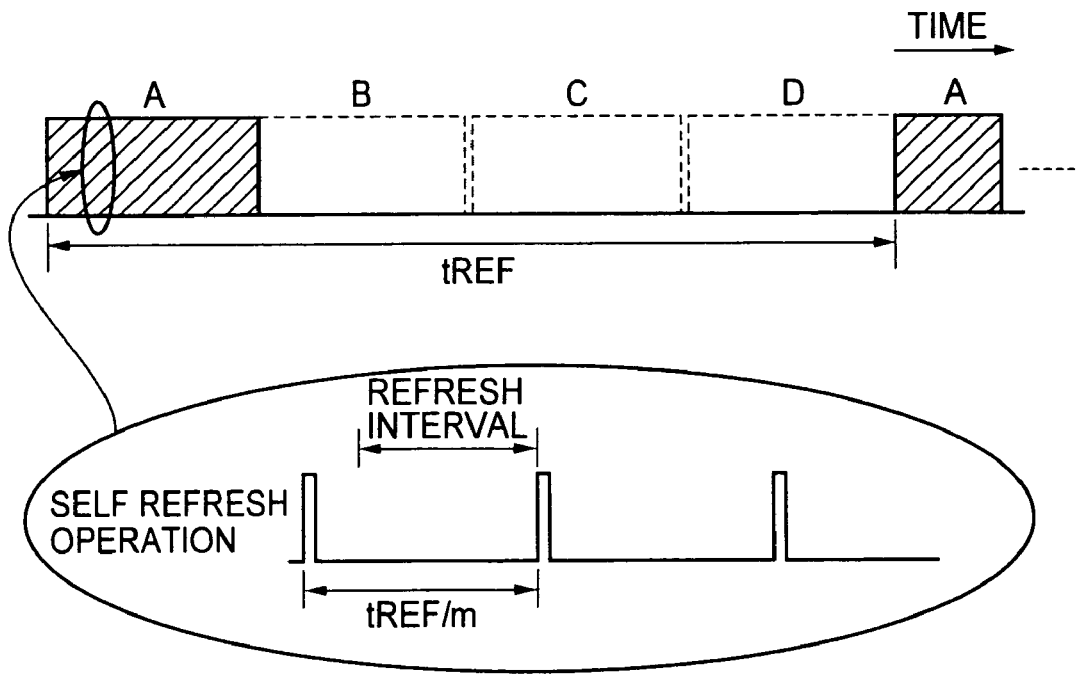
FIG. 11 is a table showing relations between contents of information held in a mode register of a memory device based on a conventional technique and spaces to be a target to which self refreshment is performed.
FIG. 12 is a timing chart pertaining to a self refresh operation in the memory device based on the conventional technique.

The memory cell array 11 is made by arranging memory cells having a schematic configuration exemplified in FIG. 9 schematically in an array. The memory cell array 11 stores data (information) transmitted from an external memory control device 60. Because charges held in the memory cell array 11 naturally decrease or are extracted to the outside at the time of reading of data, it is needed to refresh the memory cell array 11 at every predetermined timing, or to refresh it when the charge held by several memory cell becomes less than a predetermined level. The memory cell array 11 is similar to the one used in a conventional general memory device of a dynamic type such as a DRAM.

The data read/write circuit 40 has a function of writing the data transmitted from the external memory control device 60 on the outside of the memory device into a corresponding address in the memory cell array 11 and a function of reading the data stored in the memory cell array 11 on the basis of the data, and a command signal for the writing or the reading. The data writing function and the data reading function of the data read/write circuit 40 to and from the memory cell array 11 are also basically similar to the ones used for the conventional general memory device of a dynamic type such as the DRAM.

The refresh circuit 20 basically has a function of amplifying the data stored in the memory cell array 11 at, for example, every predetermined timing such as a fixed refresh period to rewrite the amplified data in the memory cell array 11, and thereby of refreshing the data to hold the data continuously. Incidentally, the refresh circuit 20 is set so that the operation of the refresh circuit 20 is controlled by the refresh control circuit 30, which will be described later, so as not to perform the refreshment of the memory-cells in the memory spaces which are not used at the time of the performance of refresh operation and are substantially unnecessary for being refreshed. The refresh circuit 20 may be set to perform the above-mentioned refreshment of data through the data read/write circuit 40, or may be set to perform the above-mentioned refreshment of data directly to the memory cell array 11 through another route from the data read/write circuit 40. However, it is needless to say that it is more general to perform the data refreshment through the data read/write circuit 40 or in cooperation with the data read/write circuit 40.

The refresh control circuit 30 performs the control such that the address space in the memory space of the memory cell array 11 is previously divided (allotted) into a plurality of sub memory spaces, and that the data refreshment is performed only to the sub memory spaces which have been used immediately before the refreshment and includes memory cells holding data (charges) necessary to be refreshed among the plurality of the sub memory spaces, but that the data refreshment is not performed to the memory spaces which have not been in use and includes no memory cells holding data (charges) at all not to need the refreshment.

The principal part of the refresh control circuit 30 can be configured to be the one exemplified in FIG. 2 more in detail. The refresh control circuit 30 includes a using memory space register 31 and a plurality of AND circuit elements 32a, 32b, 32c and 32d, the number of which corresponds to the plurality of sub memory spaces. Incidentally, hereupon for simplifying the description and illustration, the refresh control circuit 30 will be described on an assumption that the whole memory space of the memory cell array 11 is divided into four sub memory spaces of A, B, C and D.

The using memory space register 31 stores four-bit memory using memory space information of A, B, C and D corresponding to the sub memory spaces A, B, C and D, respectively. The memory using memory space information can be obtained from the write data, their address data, command signals for writing commands or reading commands, and the like, all transmitted from the external memory control device 60 to the memory device 30.

More specifically, for example, when even one address in the sub memory space A is in use at the time of writing or reading immediately before a refresh operation, the memory using space information pertaining to the sub memory space A takes "1" as the information indicating "in use", and the information "1" is stored (memorized) in the bit A of the using memory space register 31. Alternatively, when all of the addresses in the sub memory space A are not in use at the time of writing or reading immediately before refresh operation, the memory using space information pertaining to the sub memory space A takes "0" as the information indicating "not in use", and the information "0" is stored in the bit A of the using memory space register 31.

A plurality (herein four) of AND circuit elements 32a, 32b, 32c and 32d severally take a logical product of a self refresh starting signal and an output of the using memory space register 31 to output or not to output self refresh operation signals A', B', C' and D', respectively. The self refresh starting signals are signals for specifying the addresses to be the objects of self refreshment. The self refresh starting signals are output from, for example, a self refresh timer or a refresh address counter, which are not shown in FIG. 1. The self refresh starting signals outputs, for example, "1" in the order A', B', C', D', A', B', C', D' . . . .

These AND circuit elements 32a, 32b, 32c and 32d operate logical products of the data ("1" or "0") of the memory using space information stored in the using memory space register 31 and the self refresh starting signals ("1") input at predetermined timing in order (for example, periodically). When an operation result is "1", or in a case where the data of the memory using space information is "1" indicating the sub memory space being in use when the self refresh starting signal "1", the operation result becomes $1 \times 1 = 1$, and the result is output as the self refresh operating signal. However, in a case where the data of the memory using space information is "0" indicating the sub memory space being not in use when the self refresh starting signal "1" is input, the operation result becomes $1 \times 0 = 0$. Consequently, the self refresh operating signal is not output in this case. That is, as schematically shown in FIG. 3 as a list, when the data of the memory using space information is that bit A=1, the sub memory space A is an object of the self refreshment. When the data of the memory using space information is that bit B=1, the sub memory space B is an object of the self refreshment. When the data of the memory using space information is that bit C=1, the sub memory space C is an object of the self refreshment. When the data of the memory using space information is that bit D=1, the sub memory space D is an object of the self refreshment, and so forth. As above, whether self refreshment of the four sub memory spaces A, B, C and D is performed or not is severally controlled independently according to whether they are in use or not until immediately before the self refreshment.

More specifically, for example, in a case where only the sub memory space B is in use and the other sub memory spaces A, C and D are not in use until immediately before self refreshment is exemplified, only the logical product at the bit of the sub memory space B becomes $1 \times 1 = 1$, and only the self refresh operation signal B' is output because the data stored in the using memory space register 31 are A=0, B=1, C=0 and D=0 in this case. Then, the refresh circuit 20 receives the self refresh operating signal B', and performs self refreshment only to the sub memory space B. The refresh circuit 20 does not perform the self refreshment to the other sub memory spaces A, C and D (the refreshment is daringly omitted).

In such a way, it becomes possible that self refreshment is performed to the sub memory spaces to which storage holding is necessary, and that self refreshment is not performed to the sub memory spaces which have not to be used, and to which storage holding is not necessary. As a result, it becomes possible to achieve decreasing the power consumption owing to unnecessary self refreshment greatly.

[First Embodiment]

Figure 4:
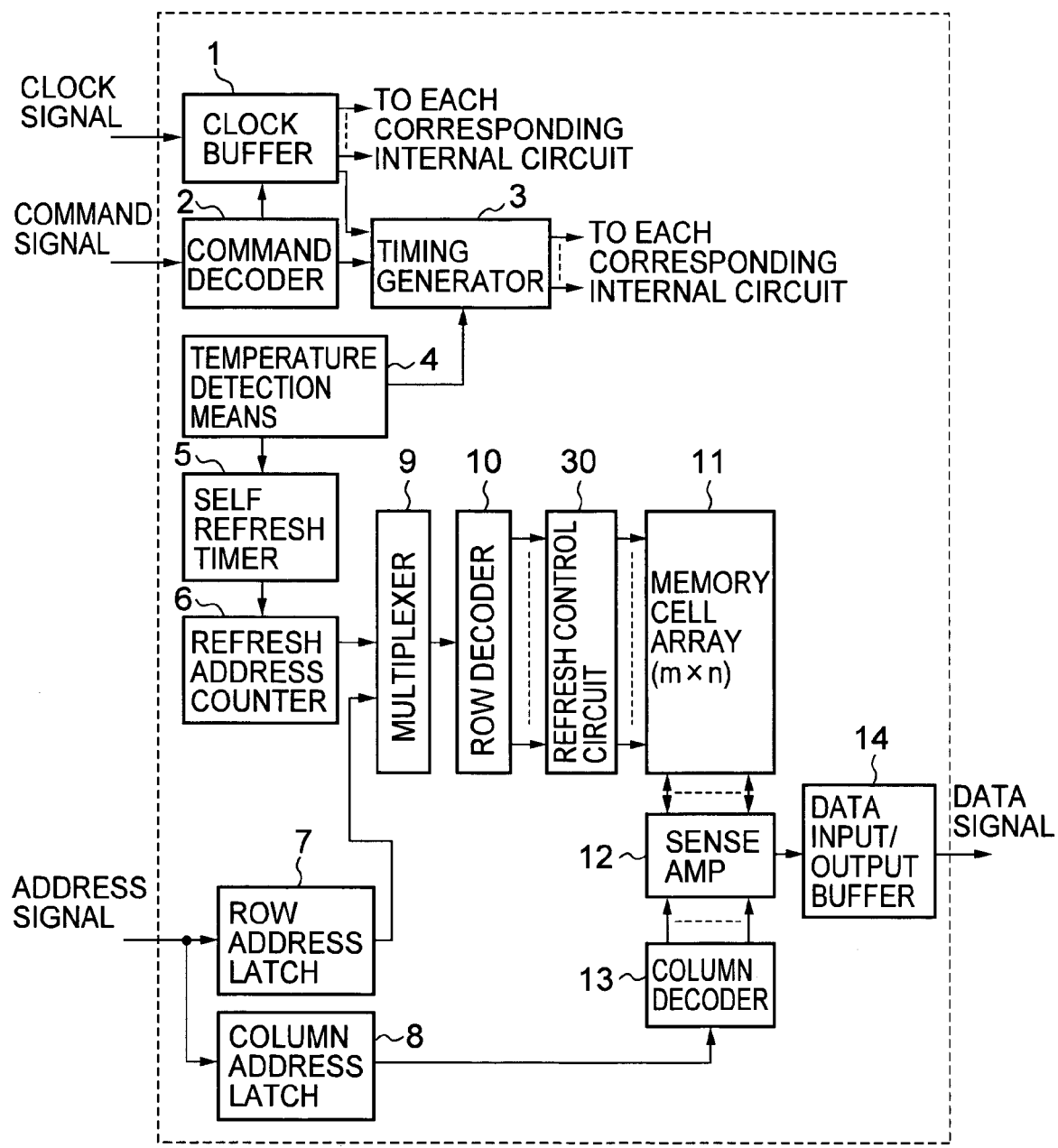
FIG. 4 is a block diagram showing a schematic configuration of a DRAM being the memory device according to a first embodiment.

FIG. 4 shows the schematic configuration of a memory device (DRAM) according to a first embodiment. The DRAM includes the following components as its principal part: a clock buffer 1, a command decoder 2, a timing generator 3, a temperature detection means 4, a self refresh timer 5, a refresh address counter 6, a row address latch 7, a column address latch 8, a multiplexer 9, a row decoder 10, a memory cell array 11, a sense amplifier 12, a column decoder 13, a data input/output buffer 14 and a refresh control circuit 30. Hereupon, the self refresh timer 5, the refresh address counter 6, the row address latch 7, the column address latch 8, the multiplexer 9, the row decoder 10, the sense amplifier 12 and the column decoder 13 collectively correspond to the refresh circuit 20 described in the former embodiment substantially. Moreover, the row address latch 7, the column address latch 8, the multiplexer 9, the row decoder 10, the sense amplifier 12 and the column decoder 13 correctively correspond to the data read/write circuit 40 described in the former embodiment substantially.

The clock buffer 1 receives a clock signal from the outside to distribute the received clock signal to the internal circuits. The command decoder 2 decodes a command signal from the outside to discriminate the operation such as writing, reading or automatic refreshing. The timing generator 3 generates various kinds of timing necessary for internal operation. The temperature detection means 4 detects a temperature in the DRAM, a temperature in the vicinity of the memory cell array 11 or the like.

The self refresh timer 5 generates a clock for determining an operation interval at the time of a self refreshing mode. The refresh address counter 6 counts up its counted value one by one every performance of refreshment operation at the time of automatic refreshment from the outside and self refreshment, and outputs row addresses at the time of refreshment in order.

The row address latch 7 and the column address latch 8 separates the address signal transmitted from the outside in time division into row addresses and column addresses to store the addresses temporarily.

The multiplexer 9 selects either refreshment addresses or row addresses at the time of ordinary operation (at the time of the operation of writing or reading) on the basis of the command signal at that time, or the like. The row decoder 10 selects one row (one line) among all of the m row arrays (m row lines) at a time.

The memory cell array 11 comprises memory cells arranged in an orthogonal array made of m rows×n columns. Each memory cell stores information in a binary state of holding charges or not holding charges. When one row is selected, the charges held by each of the n memory cells connected the selected row as information are read out (are extracted) to the sense amplifier 12. At this time, it is needless to say that it is regarded that the information "0" can be read from a memory cell holding substantially no charge.

The sense amplifier 12 amplifies the charges read from the memory cells as information at a predetermined gain to convert the charges to a data signal, and outputs the data signal. The column decoder 13 selects a column corresponding to a data signal from the outside among the n columns (n pieces) on the basis of the data signal and an address signal from the outside.

The data input/output buffer 14 functions as a buffer for inputting the data to be written into the sense amplifier 12 at the time of a writing operation, and functions as a buffer for outputting the data read at the time of a reading operation to the outside.

In reading operation of the so-called general DRAM configuration which has been described above and does not include the refresh control circuit 30, a row line is selected on the basis of the row address specified by an external address' signal. Then, the data (the information held as the existence or the nonexistence of charges) held in the memory cells of each of the n columns connected to the selected row line is read to be amplified by the sense amplifier 12. Then, the data of each column amplified by the sense amplifier 12 is collected to be a data signal (read data) of a group composed of the amplified data of a column at every column by the column decoder 13, and the data signal is selected by the sense amplifier 12. The selected data signal is output to the outside through the data input/output buffer 14.

Moreover, in a writing operation, the data stored in the memory cell array 11 is read at every row, and is amplified by the sense amplifier 12. After that, the information held by each of the memory cells connected to the column specified by the column decoder 13 is replaced with the write data from the outside, thereby writing (re-writing) is performed.

The refresh control circuit 30 is inserted between the row decoder 10 and the memory cell array 11. When refresh operation is performed, the refresh control circuit 30 performs the following control. That is, the address space in the memory space of the memory cell array 11 is previously divided into a plurality of sub memory spaces. The sub memory spaces are allotted so that refreshment control can be performed to each of them separately. Data refreshment is performed only to the sub memory spaces having the memory cells which are in use immediately before the refreshment and hold the data necessary to be refreshed among the plurality of sub memory spaces. The refreshment at that time is not performed to the memory spaces which are not in use and have no memory cells holding data at all not to need refreshment as a result. On the other hand, at the time of an ordinary operation such as reading data or writing data, the refresh control circuit 30 does not intervene in the function of the row decoder 10 to the memory cell array 11 so as not to disturb the ordinary row selection function (for example, the operation of selecting rows one by one line sequentially, or the like) as the row decoder 10 at that time.

Figure 5:
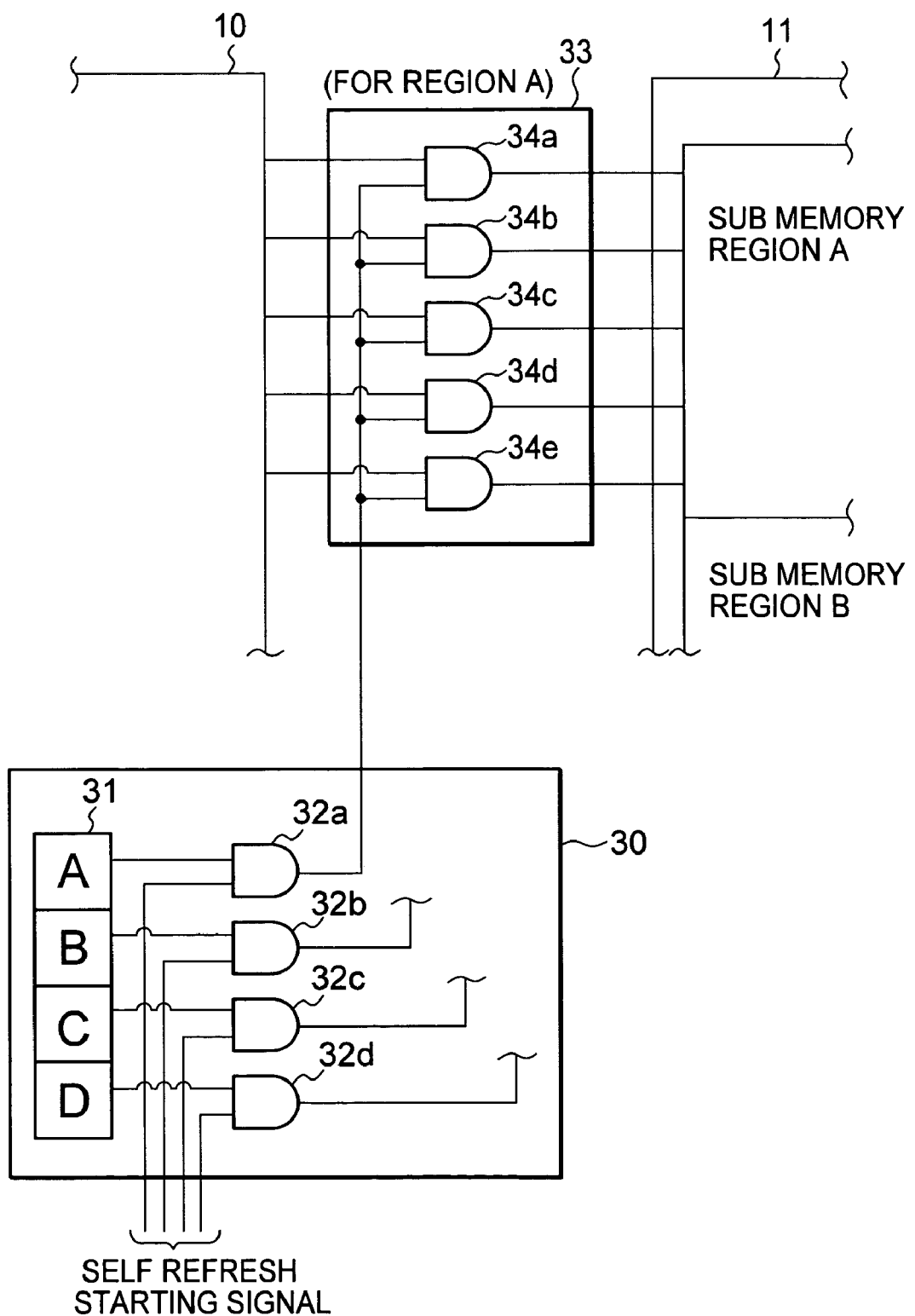
FIG. 5 is a block diagram showing a principal part of a refresh control circuit extracted from the DRAM being the memory device according to the first embodiment.

FIG. 5 shows the principal part of the refresh control circuit 30 in the DRAM of the first embodiment by extracting the principal part from the refresh control circuit 30. Incidentally, in FIG. 5, for simplifying illustration and the description thereof, it is supposed that each sub memory space includes five row lines severally, and only the sub memory space A will be extracted to be described among the sub memory spaces A, B, C and D. It is needless to say that the number of the actual row lines (the number of rows) is far larger.

The refresh control circuit 30 of the first embodiment includes the main body of the refresh control circuit 30 and a refresh selection unit 33. The main body of the refresh control circuit 30 is configured as illustrated in FIG. 2 to include the using memory space register 31 and the AND circuits elements 32a, 32b, 32c and 32d. The refresh selection unit 33 receives the output from the main body of the refresh control circuit 30. Then, the refresh selection unit 33 performs either of the following two operations. That is, the refresh selection unit 33 selects a row in the sub memory space A for performing the refreshment of the sub memory space A at the time of refreshment. Alternatively, although the row decoder 10 specifies the selection of a row in the sub memory space A, the refresh selection unit 33 intervenes in the selection of the row decoder 10 at that time to the sub memory space A so as not to select (omit) the row in the sub memory space A.

In the operation of the refresh control circuit 30, for example, in the case where the sub memory space A is in its using state and the output from the main body of the refresh control circuit 30 is that the sub memory space A="1", the signal "1" is severally input into one side terminals of AND circuits 34a, 34b, 34c and 34d of the rows in the refresh selection unit 33. When a signal "1" for specifying the selection of each row is line sequentially input to the other side terminals of the AND circuits 34a, 34b, 34c and 34d to each row from the row decoder 10 as an ordinary self refreshment mode, the logical products of the AND circuit 34a, 34b, 34c and 34d become 1×1=1 in order. Consequently, ordinary self refreshment is performed.

However, in a case where the sub memory space A is not in use and the output from the main body of the refresh control circuit 30 is that the sub memory space A="0", the signal "0" is input into one side terminal of the AND circuits 34a, 34b, 34c and 34d of the rows in the refresh selection unit 33. Then, when a signal "1" for specifying the selection is line sequentially input into the other terminal of the AND circuits 34a, 34b, 34c and 34d of the rows from the row decoder 10 as the ordinary self refresh mode, the logical products of the AND circuits 34a, 34b, 34c and 34d become 1×0=0 in order. Consequently, the self refreshment is not performed in the sub memory space A.

Moreover, at the time of an ordinary read operation or an ordinary write operation, the main body of the refresh control circuit 30 outputs the signal "1" to all of the sub memory spaces A, B, C and D, and thereby it is possible not to intervene the selection of the row decoder 10 to the memory cell array 11.

Figure 6:
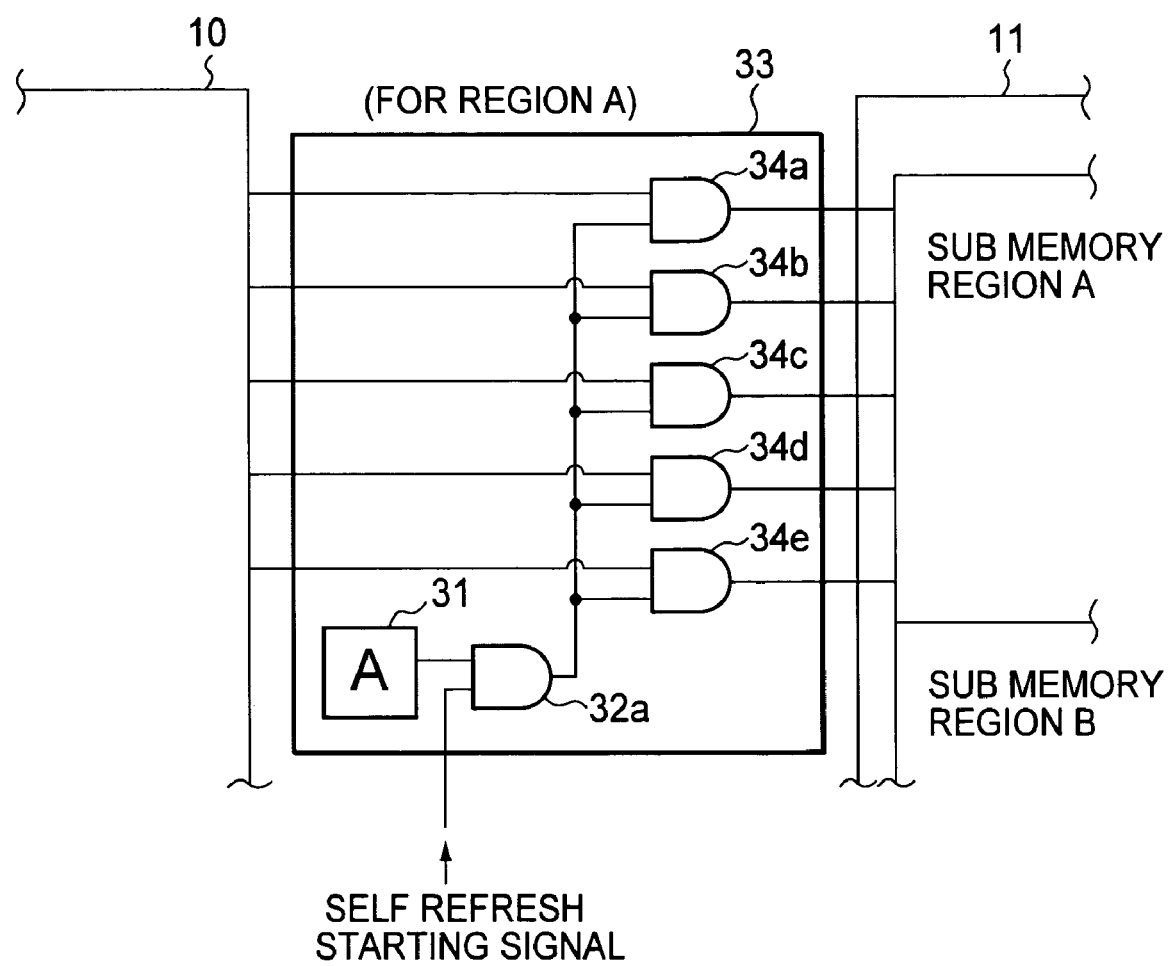
FIG. 6 is a block diagram showing one of variations of the principal part of the refresh control circuit in the DRAM being the memory device according to the first embodiment.

Incidentally, the main body of the refresh control circuit 30 and the refresh selection unit 33 may be provided in the inside of the row decoder 10. Alternatively, as exemplified in FIG. 6, each refresh selection unit 33 of each sub memory space may be provided with a part of the refresh control circuit 30 for performing the control of the sub memory space therein (for example, the part for the sub memory space A (A bit) of the using memory space register 31 in the refresh control circuit 30 and the AND circuit 32a are provided in the refresh selection unit 33 for the sub memory space A).

[Second Embodiment]

Figure 7:
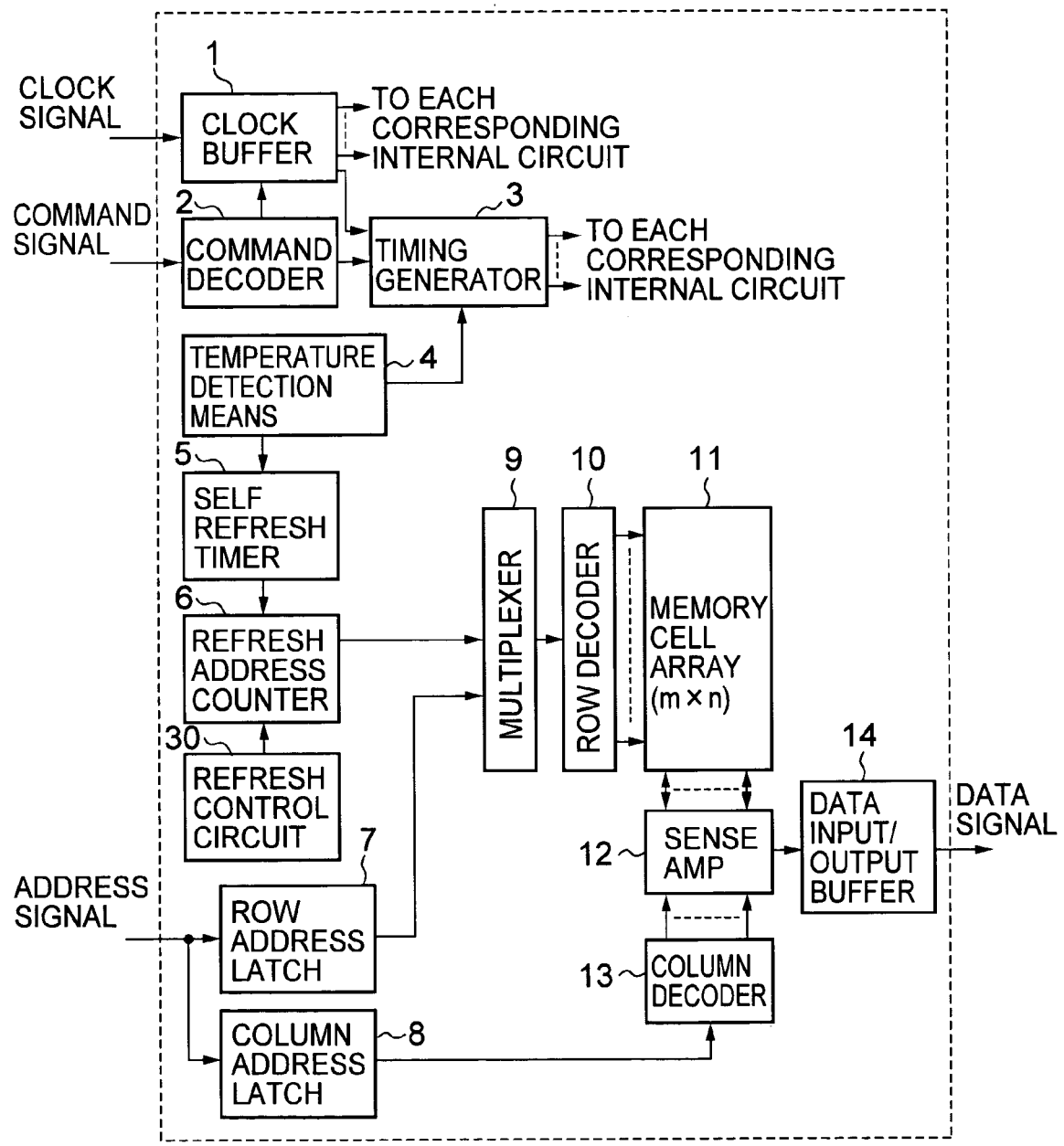
FIG. 7 is a block diagram showing a schematic configuration of a DRAM being a memory device according to a second embodiment.

FIG. 7 shows a schematic configuration of a memory device (DRAM) according to a second embodiment. In the second embodiment, an example of the configuration in which a refresh control circuit 30 is attached to a refresh address counter 6 will be described. Incidentally, the same reference numerals as those in the first embodiment are attached to the similar components as those in the first embodiment, and they will be referred to as the same names as those in the first embodiment. Furthermore, their detailed descriptions are omitted for simplifying the descriptions.

The refresh control circuit 30 of the second embodiment performs the control of whether refreshment to each sub memory space is performed or not by intervening in the function of the refresh address counter 6 for outputting a row address to which refreshment is performed.

In further detail, the refresh control circuit 30 as shown in FIG. 2 is attached to the refresh address counter 6. Assuming that a sub memory space A and a sub memory space C are in use at the time of refreshment, and that a sub memory space B and a sub memory space D are not in use, the refresh control circuit 30 intervenes in the output function of the refresh address counter 6 to input a signal "1" into the refresh address counter 6 as a self refreshment operation signal A' to the sub memory space A and a self refreshment operation signal C' to the sub memory space C, and to input a signal "0" into the refresh address counter 6 as a self refreshment operation signal B' to the sub memory space B and a self refreshment operation signal D' to the sub memory space D.

The refresh address counter 6 is set so that, in response to the inputs, the refresh address counter 6 outputs the row addresses in the sub memory space A and the sub memory space C correspondingly to the signal "1", and that the refresh address counter 6 does not output the row addresses in the sub memory space B and the sub memory space D correspondingly to the signal "0".

In such a way, it is also possible to design the refresh control circuit 30 so as to intervene in the control of refreshment operation on more previous side (source side) in comparison with the first embodiment from the point of view of the selection of row addresses at the time of refreshment.

Incidentally, it is needless to say that the refresh control circuit 30 may be provided in the refresh address counter 6.

Moreover, it is also needless to say that, at the time of an ordinary operation, the intervening of the refresh control circuit 30 against the refresh address counter 6 is stopped similarly to the first embodiment.

[Third Embodiment]

Figure 8:
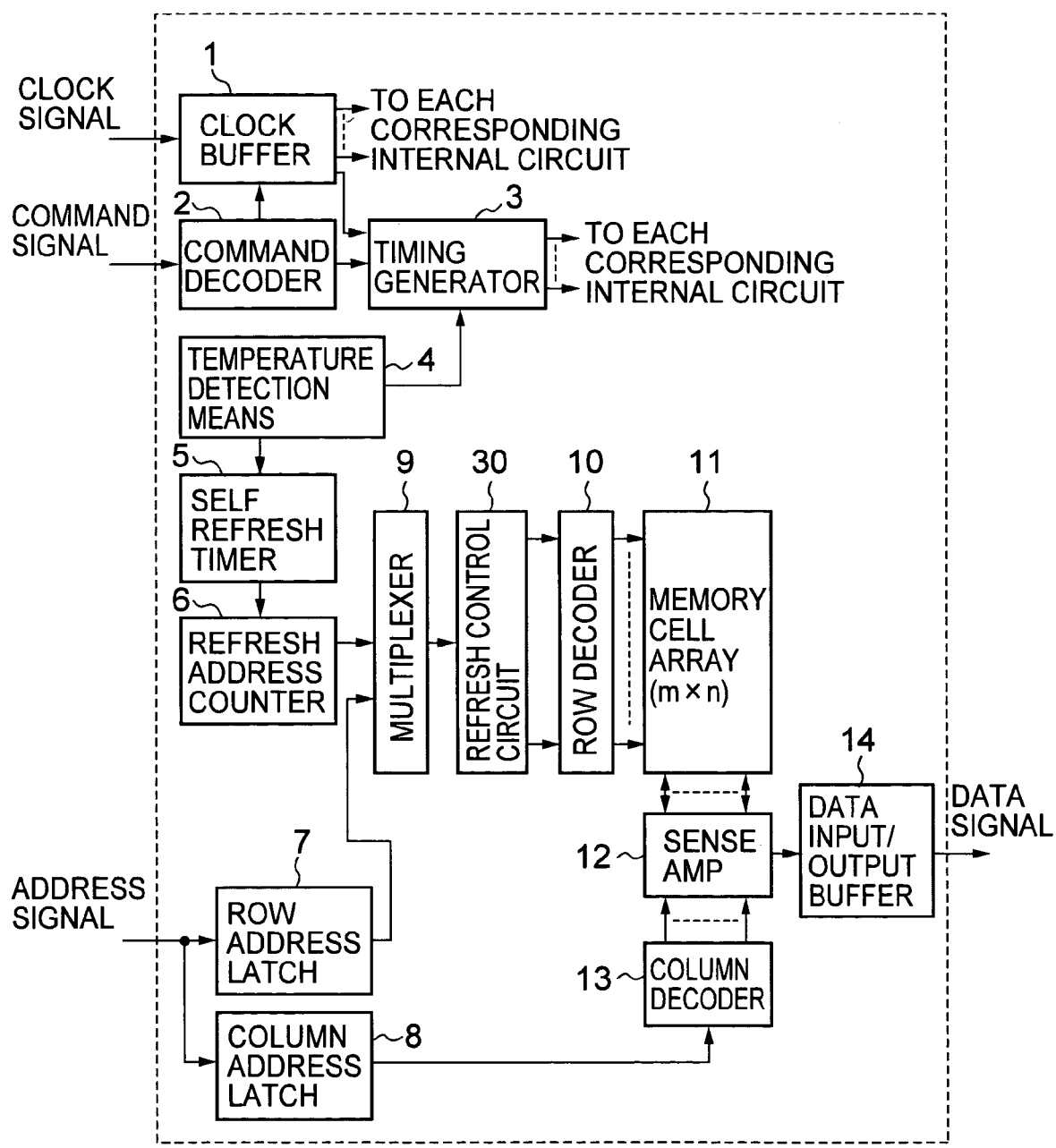
FIG. 8 is a block diagram showing a schematic configuration of a DRAM being a memory device according to a third embodiment.

FIG. 8 shows the schematic configuration of a memory device (DRAM) of a third embodiment. Incidentally, the same reference numerals as those in the first embodiment are attached to the similar components as those in the first embodiment, and they will be referred to as the same names as those in the first embodiment. Furthermore, their detailed descriptions are omitted for simplifying the descriptions.

In the third embodiment, a refresh control circuit 30 is provided between a multiplexer 9 and a row decoder 10, or between a refresh address counter 6 and the multiplexer 9. The refresh control circuit 30 intervenes in the data (binary number code) which is not yet decoded and is input from the refresh address counter 6 to the row decoder 10 through the multiplexer 9 for specifying an address at the time of refreshment at the previous stage of the decoding (namely, at the previous stage before being input into the row decoder 10) so as not to perform the refreshment of the sub memory spaces which are not used.

For example, if a case where the sub memory space B is set to include the rows from the 32nd row (word line) to the 64th row and refreshment is omitted because the memory cells of each row in the sub memory space B have not been used until the refreshment is exemplified, the refresh control circuit 30 intervenes in the output of the multiplexer 9 or the output of the refresh address counter 6 so as not to output the codes from the binary number code=0100000 corresponding to the 32nd row to the binary number code=1000000 corresponding to the 64th row (for example, the binary number code=0101000) to the row decoder 10.

Incidentally, it is needless to say that, at the time of an ordinary operation, the intervening of the refresh control circuit 30 against the refresh address counter 6 or the multiplexer 9 is stopped similarly to the first embodiment.

As specifically shown in connection with the first embodiment, the second embodiment and the third embodiment, the configuration in which the refresh control circuit 30 according to an embodiment of the present invention is incorporated in a generally configured DRAM can omit refreshment to the memory spaces which are not in use at the time of the refreshment and does not need to be refreshed, and thereby can achieve the decrease of power consumption at least for the omission of the refreshment. Furthermore, it is possible to add the refresh control circuit 30 for performing such refresh control to the inside of a memory-device having a general configuration such as a DRAM without causing the complication of the whole circuit configuration of the memory device.

Incidentally, it is needless to say that the concrete aspects of omitting refreshment to memory spaces which have not been used until the refreshment and is not necessary to be refreshed are not limited only to those of the first embodiment, the second embodiment and the third embodiment. Although each of the embodiments controls the selection of rows (row lines, or word lines) to omit the refreshment to the memory spaces unnecessary to be refreshed, the selection of the rows at the time of refreshment may be performed so as to select the rows line sequentially similarly in the case of ordinary self refreshment, and the sense amplifier 12 may not amplify the rows in the sub memory spaces which are unnecessary to be refreshed even if the rows are selected and once read out by the column decoder 13. In such a way, because the rows in the sub memory spaces unnecessary to be refreshed are also once read at the time of refreshment, the electrical energy for that reading is consumed. However, because the read signals are not amplified by the sense amplifier 12 (their amplification is omitted), at least the power consumption to be consumed at the amplification conventionally can be decreased. It is needless to say that various other aspects can be adopted.

What is claimed is:

1. A semiconductor memory device of a dynamic type for refreshing information stored in a memory space, so as to hold the information continuously by amplifying the information stored in said memory space to rewrite the amplified information in said memory space, said memory device comprising:
   a refresh control circuit for performing refreshment of the information only to a submemory space, which is in use when the refreshment of the information is performed, said submemory space holding the information necessary to be refreshed, selected from among a plurality of submemory spaces formed by a previous division of said memory space,
   wherein said refresh control circuit performs a logical product of data pertaining to whether each of said submemory spaces are in use and refresh address data to be input to each address, and performs control of whether said refreshment is performed or not to each submemory space with said refresh circuit based on a result of said logical product.

2. A semiconductor memory device of a dynamic type including a memory cell array for storing information, and a refresh circuit for refreshing the information stored in said memory cell array, so as to hold the information continuously, by amplifying the information stored in said memory cell array to rewrite the amplified information in said memory cell array, said memory device comprising:
   a refresh control circuit for controlling an operation of said refresh circuit so as to perform refreshment of the information only to a submemory space that is in use when the refreshment of the information is performed, said submemory space holding the information necessary to be refreshed, among a plurality of submemory spaces formed by previous division of an address space in a memory space of said memory cell array,
   wherein said refresh control circuit performs a logical product of data pertaining to whether each of said submemory spaces are in use and refresh address data to be input to each address, and performs control of whether said refreshment is performed or not to each submemory space with said refresh circuit based on a result of said logical product.

3. The semiconductor memory device according to claim 2, wherein said memory cell array includes a row decoder and a refresh address counter, and said row decoder and said refresh address counter are set to specify a row address to which said refreshment is performed in addresses of said memory cell array, and wherein said refresh control circuit is attached to said refresh address counter, said refresh control circuit being set to intervene in a function of said refresh address counter for outputting the row address to which said refreshment is performed so as to control whether the refreshment is performed to each of said submemory spaces.

4. The semiconductor memory device according to claim 2, wherein said memory cell array includes a row decoder and a refresh address counter, and said row decoder and said refresh address counter are set to specify a row address to which said refreshment is performed in addresses of said memory cell array, and wherein said refresh control circuit is provided inside said refresh address counter, said refresh control circuit being set to intervene in a function of said refresh address counter for outputting the row address to which said refreshment is performed so as to control whether the refreshment is performed to each of said submemory spaces.

5. The semiconductor memory device according to claim 2, further comprising a row decoder, a multiplexer and a refresh address counter connected in order to said memory cell array, and said row decoder, said multiplexer and said refresh address counter are set to specify a row address to which said refreshment is performed in addresses of said memory cell array, and wherein said refresh control circuit is inserted between said refresh address counter and said multiplexer, said refresh control circuit being set to intervene in a refresh address counter's output of the row address to which said refreshment is performed, the output being transmitted to said row decoder through said multiplexer, so as to control whether the refreshment is performed to each of said submemory spaces.

6. The semiconductor memory device according to claim 2, further comprising a row decoder, a multiplexer and a refresh address counter connected in order to said memory cell array, and said row decoder, said multiplexer and said refresh address counter are set to specify a row address to which said refreshment is performed in addresses of said memory cell array, and wherein said refresh control circuit is provided inside said multiplexer, said refresh control circuit being set to intervene in a refresh address counter's output of the row address to which said refreshment is performed, the output being transmitted to said row decoder through said multiplexer, so as to control whether the refreshment is performed to each of said submemory spaces.

7. The semiconductor memory device according to claim 2, wherein said memory space is divided into a plurality of information spaces to store respective kinds of contents of information different from one another, and at least one of said plurality of information spaces is further divided into said plurality of submemory spaces.

8. A semiconductor memory device, of a dynamic type including a memory cell array for storing information, and a refresh circuit for refreshing the information stored in said memory cell array, so as to hold the information continuously, by amplifying the information stored in said memory cell array to rewrite the amplified information in said memory cell array, said memory device comprising:
   a refresh control circuit for controlling an operation of said refresh circuit so as to perform refreshment of the information only to a submemory space that is in use when the refreshment of the information is performed, said submemory space holding the information necessary to be refreshed, among a plurality of submemory spaces formed by previous division of an address space in a memory space of said memory cell array,
   wherein said memory cell array includes a row decoder, and said row decoder is set to specify a row address to which said refreshment is performed in addresses of said memory cell array, and wherein said refresh control circuit is inserted between said memory cell array and said row decoder, said refresh control circuit being set to intervene in a function of said row decoder for specifying the row address to which said refreshment is performed so as to control whether said refreshment is performed to each of said submemory spaces.

9. The semiconductor memory device of a dynamic type including a memory cell array for storing information, and a refresh circuit for refreshing the information stored in said memory cell array, so as to hold the information continuously, by amplifying the information stored in said memory cell array to rewrite the amplified information in said memory cell array, said memory device comprising:

a refresh control circuit for controlling an operation of said refresh circuit so as to perform refreshment of the information only to a submemory space that is in use when the refreshment of the information is performed, said submemory space holding the information necessary to be refreshed, among a plurality of submemory spaces formed by previous division of an address space in a memory space of said memory cell array, wherein said memory cell array includes a row decoder, and said row decoder is set to specify a row address to which said refreshment is performed in addresses of said memory cell array, and wherein said refresh control circuit is provided in said row decoder, said refresh control circuit being set to intervene in a function of said row decoder for specifying the row address to which said refreshment is performed so as to control whether the refreshment is performed to each of said submemory spaces.

10. A refresh control circuit for a semiconductor memory device of a dynamic type for refreshing information stored in a memory space, so as to hold the information continuously, by amplifying the information stored in said memory space to rewrite the amplified information in said memory space, wherein said refresh control circuit performs control of refreshment of the information only to a submemory space, which is in use when the refreshment of the information is performed, said submemory space holding the information necessary to be refreshed, selected from among a plurality of submemory spaces formed by a division of said memory space, and wherein said refresh control circuit performs a logical product of data pertaining to whether each of said sub memory spaces are in use and refresh address data to be input to each address, and performs control of whether said refreshment is performed to each submemory space with said refresh circuit based on a result of said logical product.

11. A refresh control circuit for a semiconductor memory device of a dynamic type including a memory cell array for storing information and a refresh circuit for refreshing the information stored in said memory cell array, so as to hold the information continuously, by amplifying the information stored in said memory cell array to rewrite the amplified information in said memory cell array, wherein said refresh control circuit controls an operation of said refresh circuit so as to perform refreshment of the information only to a sub memory space which is in use when the refreshment of the information is performed, said submemory space, holding the information necessary to be refreshed, said submemory space being selected from among a plurality of sub memory spaces formed by previous division of an address space in a memory space of said memory cell array, and wherein said refresh control circuit performs a logical product of data pertaining to whether each of said sub memory spaces are in use and refresh address data to be input to each address, and performs control of whether said refreshment is performed to each submemory space with said refresh circuit based on a result of said logical product.

12. The refresh control circuit according to claim 11, wherein said memory space is divided into a plurality of information spaces to store respective kinds of contents of information different from one another, and at least one of said divided information spaces is further divided into said plurality of submemory spaces.

13. A method for refreshing storage in a semiconductor memory device of a dynamic type for refreshing information stored in a memory space, so as to hold the information continuously, by amplifying the information stored in said memory space to rewrite the amplified information in said memory space, said method comprising the steps of:

dividing said memory space into a plurality of submemory spaces; and performing refreshment of the information only to a selected submemory space among the plurality of submemory spaces, said selected submemory space being in use when the refreshment of the information is performed, said submemory space holding the information necessary to be ref refreshed, and performing a logical product of data pertaining to whether each of said sub memory spaces is in use and refresh address data to be input to each address, wherein control of whether said refreshment is performed to each submemory space is performed based on a result of said logical product.

14. A refresh method for refreshing information stored in a memory cell array, so as to hold the information continuously, by amplifying the information to rewrite the amplified information in said memory cell, said memory cell array being provided in a semiconductor memory device of a dynamic type, said method comprising the steps of:

dividing an address space in a memory space of said memory cell array into a plurality of submemory spaces;

performing refreshment of the information only to a selected submemory space among the plurality of submemory spaces, said selected submemory space being in use when the refreshment of the information is performed, said submemory space holding the information necessary to be ref refreshed, and performing a logical product of data pertaining to whether each of said sub memory spaces is in use and refresh address data to be input to each address, wherein control of whether said refreshment is performed to each submemory space is performed based on a result of said logical product.

15. The refresh method according to claim 14, wherein said memory space is divided into a plurality information spaces to store respective kinds of contents of information different from one another, and at least one of said divided information spaces is further divided into the plurality of submemory spaces to perform control of said refreshment of the information to each of said submemory spaces.

* * * * *

UNITED STATES PATENT AND TRADEMARK OFFICE
CERTIFICATE OF CORRECTION

| | | |
|---|---|---|
| PATENT NO. | : 7,180,806 B2 | Page 1 of 1 |
| APPLICATION NO. | : 10/786834 | |
| DATED | : February 20, 2007 | |
| INVENTOR(S) | : Shigeji Ikeda et al. | |

It is certified that error appears in the above-identified patent and that said Letters Patent is hereby corrected as shown below:

In Column 4, Line 21, delete "," after "cannot";

In Column 16, Line 50, delete "," after "device";

In Column 18, Line 29, delete "ref";

In Column 18, Line 52, delete "ref";

Signed and Sealed this

Twenty-sixth Day of February, 2008

JON W. DUDAS
*Director of the United States Patent and Trademark Office*